(12) United States Patent
Deng et al.

(10) Patent No.: US 12,261,236 B2
(45) Date of Patent: Mar. 25, 2025

(54) CONDUCTIVE MEMBER AND MANUFACTURING METHOD THEREFOR, AND PHOTOVOLTAIC MODULE AND MANUFACTURING METHOD THEREFOR

(71) Applicants: CSI CELLS CO., LTD., Suzhou (CN); CANADIAN SOLAR MANUFACTURING (CHANGSHU) INC., Suzhou (CN); CSI SOLAR CO., LTD., Suzhou (CN)

(72) Inventors: Shifeng Deng, Suzhou (CN); Jingbing Dong, Suzhou (CN); Hui Chen, Suzhou (CN); Tao Xu, Suzhou (CN); Guoqiang Xing, Suzhou (CN)

(73) Assignees: CSI CELLS CO., LTD., Suzhou (CN); CANADIAN SOLAR MANUFACTURING (CHANGSHU) INC., Suzhou (CN); CSI SOLAR CO., LTD., Suzhou (CN)

( * ) Notice: Subject to any disclaimer, the term of this patent is extended or adjusted under 35 U.S.C. 154(b) by 269 days.

(21) Appl. No.: 17/625,732

(22) PCT Filed: May 9, 2020

(86) PCT No.: PCT/CN2020/089307
§ 371 (c)(1),
(2) Date: Jan. 8, 2022

(87) PCT Pub. No.: WO2021/004146
PCT Pub. Date: Jan. 14, 2021

(65) Prior Publication Data
US 2022/0293807 A1    Sep. 15, 2022

(30) Foreign Application Priority Data
Jul. 9, 2019   (CN) .......................... 201910616823.X (51) Int. Cl.
*H01L 31/05* (2014.01)
*H01L 31/056* (2014.01)
*H01L 31/18* (2006.01)

(52) U.S. Cl.
CPC ...... *H01L 31/0508* (2013.01); *H01L 31/0516* (2013.01); *H01L 31/056* (2014.12); *H01L 31/18* (2013.01)

(58) Field of Classification Search
CPC ............. H01L 31/0508; H01L 31/0516; H01L 31/056; H01L 31/18; H01L 31/054;
(Continued)

(56) References Cited

FOREIGN PATENT DOCUMENTS

| CN | 103548152 A | * | 1/2014 | ......... H01L 31/0508 |
| CN | 102593223 B | * | 5/2015 | ............. B21D 13/04 |

(Continued)

OTHER PUBLICATIONS

English machine translation of CN 103548152 A (Year: 2024).*
(Continued)

*Primary Examiner* — Angelo Trivisonno
(74) *Attorney, Agent, or Firm* — Cheng-Ju Chiang (57) ABSTRACT

Disclosed are a conductive member for connecting photovoltaic cells and a manufacturing method for the conductive member, and a photovoltaic module and a manufacturing method therefor. The conductive member comprises a first segment and a second segment in a length direction thereof, wherein the first segment and the second segment both have a planar contact surface; the second segment has a reflective surface facing away from a planar contact surface thereof; the first segment has a first cross section perpendicular to a length direction thereof; the second segment has a second cross section perpendicular to a length direction thereof; and the area of the first cross section is equal to the area of the second cross section.

7 Claims, 9 Drawing Sheets

(58) Field of Classification Search
CPC ............. H01L 31/0504; H01L 31/0547; H01L 31/188; Y02E 10/52
See application file for complete search history.

(56) References Cited

FOREIGN PATENT DOCUMENTS

| | | | | |
|---|---|---|---|---|
| CN | 106024959 A | * | 10/2016 | ......... H01L 31/0504 |
| CN | 207664054 U | * | 7/2018 | |
| CN | 108767046 A | | 11/2018 | |
| CN | 208240702 U | | 12/2018 | |
| CN | 109786492 A | | 5/2019 | |
| CN | 208923174 U | * | 5/2019 | |
| CN | 209993611 U | | 1/2020 | |
| CN | 210136883 U | | 3/2020 | |
| CN | 210474973 U | | 5/2020 | |
| DE | 202010011171 U1 | | 11/2010 | |

OTHER PUBLICATIONS

English machine translation of CN 102593223 B (Year: 2024).*
English machine translation of CN 208923174 U (Year: 2024).*
English machine translation of CN 207664054 U (Year: 2024).*
English machine translation of Cn 106024959A (Year: 2024).*

* cited by examiner

CONDUCTIVE MEMBER AND MANUFACTURING METHOD THEREFOR, AND PHOTOVOLTAIC MODULE AND MANUFACTURING METHOD THEREFOR

CROSS REFERENCE TO RELATED APPLICATIONS

The present invention is a 35 U.S.C. § 371 National Phase conversion of International (PCT) Patent Application No. PCT/CN2020/089307, filed on May 9, 2020, which claims benefit of Chinese Application No. 201910616823.X, filed on Jul. 9, 2019, the disclosure of which is incorporated by reference herein. The PCT International Patent Application was filed and published in Chinese.

TECHNICAL FIELD

The present invention relates to the field of photovoltaic (PV) technologies, and in particular, to a conductive member and a method for manufacturing the same, and a photovoltaic module and a method for manufacturing the same.

BACKGROUND

In a conventional photovoltaic module, a conductive member is commonly used to implement electrical connection between adjacent cells. However, the conventional photovoltaic module has cell gaps, and the utilization of light irradiated on a cell surface is low, resulting in limited power generation per unit area of the photovoltaic module.

Therefore, it is necessary to improve the prior art to resolve the foregoing technical problem.

SUMMARY

The present invention provides a conductive member and a method for manufacturing the same, and a photovoltaic module and a method for manufacturing the same, to increase the power generation per unit area of the photovoltaic module.

To achieve the foregoing objective of the present invention, technical solutions provided in embodiments of the present invention are as follows:

A conductive member for electrically connecting PV cells is provided. The conductive member comprises a non-light-reflective section and a light-reflective section in a length direction of the conductive member, the non-light-reflective section and the light-reflective section each have a planar contact surface, the light-reflective section has a reflective surface facing away from the planar contact surface of the light-reflective section, the non-light-reflective section has a first cross section perpendicular to a length direction of the non-light-reflective section, the light-reflective section has a second cross section perpendicular to a length direction of the light-reflective section, and an area of the first cross section is equal to an area of the second cross section.

A photovoltaic module is further provided in the present invention, comprising a first PV cell, a second PV cell, and a conductive member electrically connecting the first PV cell and the second PV cell. The conductive member comprises a non-light-reflective section electrically connected to a back surface of the first PV cell and a light-reflective section electrically connected to a front surface of the second PV cell, the non-light-reflective section and the light-reflective section each have a planar contact surface, the light-reflective section has a reflective surface facing away from the planar contact surface of the light-reflective section, the non-light-reflective section has a first cross section perpendicular to a length direction of the non-light-reflective section, the light-reflective section has a second cross section perpendicular to a length direction of the light-reflective section, and an area of the first cross section is equal to an area of the second cross section.

A method for manufacturing a photovoltaic module is further provided in the present invention, comprising: providing a first PV cell; providing a second PV cell; providing a conductive member with a preset length, where the conductive member comprises a non-light-reflective section and a light-reflective section, the non-light-reflective section and the light-reflective section each have a planar contact surface, the light-reflective section has a reflective surface facing away from the planar contact surface of the light-reflective section, the non-light-reflective section has a first cross section perpendicular to a length direction of the non-light-reflective section, the light-reflective section has a second cross section perpendicular to a length direction of the light-reflective section, and an area of the first cross section is equal to an area of the second cross section; electrically connecting the non-light-reflective section of the conductive member to a back surface of the first PV cell; and electrically connecting the light-reflective section of the conductive member to a front surface of the second PV cell.

A method for manufacturing a conductive member is further provided in the present invention, comprising: providing a to-be-processed conductive member extending longitudinally, the to-be-processed conductive member comprising a first section and a second section in a length direction of the to-be-processed conductive member; applying deformation pressure to the first section of the to-be-processed conductive member, so that the first section is deformed into a light-reflective section; and applying deformation pressure to the second section of the to-be-processed conductive member, so that the second section is deformed into a non-light-reflective section, where the non-light-reflective section and the light-reflective section each have a planar contact surface, the light-reflective section has a reflective surface facing away from the planar contact surface of the light-reflective section, the non-light-reflective section has a first cross section perpendicular to a length direction of the non-light-reflective section, the light-reflective section has a second cross section perpendicular to a length direction of the light-reflective section, and an area of the first cross section is equal to an area of the second cross section.

In the technical solutions provided in the embodiments of the present invention, the light-reflective section of the conductive member can be used to reflect light to a cell surface, thereby increasing the optical utilization of a light-receiving surface of the photovoltaic module, and further increasing the power generation of the photovoltaic module.

BRIEF DESCRIPTION OF THE DRAWINGS

Some specific embodiments of the present invention are described in detail below in an exemplary rather than restrictive manner with reference to the accompanying drawings. The same reference numerals in the accompanying drawings indicate the same or similar components or parts. A person skilled in the art should understand that the drawings are not necessarily drawn to scale. In the accompanying drawings.

DETAILED DESCRIPTION

The present invention is described in detail below with reference to the implementations shown in the accompanying drawings. However, the implementations do not limit the present invention, and structural, method, or functional transformations made by a person of ordinary skill in the art according to the implementations are included in the protection scope of the present invention. "First" and "second" do not represent any sequence relationship, but are only used for a distinguishing purpose for ease of description. For a person skilled in the art, the specific meaning of the above terms can be clearly understood.

A photovoltaic module usually comprises several PV cells arranged in an array. The PV cells can be connected to form a plurality of cell strings, and each cell string is connected in series and/or parallel to form a module. In each cell string, two adjacent PV cells can be electrically connected by a conductive material (such as a copper tape or conductive glue). Generally, a PV cell comprises a doped semiconductor substrate (for example, crystalline silicon) and electrodes formed on front and back surfaces of the semiconductor substrate. The electrodes can be formed on the semiconductor substrate by printing and sintering. Generally, the electrodes comprise several fine grid electrodes for collecting current and several main grid electrodes cross-connected to the fine grid electrodes and used for collecting current, and an extension direction of the main grid electrodes is consistent with an arrangement direction of the PV cells in the cell string. For ease of description, the "electrodes" mentioned below all refer to the main gate electrodes.

To increase the power generation per unit area of a photovoltaic module, issues that need to be considered comprise how to improve the utilization of light on a surface of the module and how to reduce or eliminate gaps between adjacent PV cells. Regarding the improvement of the utilization of light, on the one hand, a conductive member, as a connecting medium for adjacent PV cells, needs to be covered on surfaces of the PV cells. Because a region covered by the conductive member cannot receive light, the power generation of the PV cells is reduced. On the other hand, in addition to light vertically irradiated on the surfaces of the PV cells, light reflected by other objects on the surfaces of the PV cells can also bring a certain gain in cell power. Therefore, how to reduce the shielding of light on the surfaces of the cells and how to make use of the reflected light efficiently are issues to be considered in the industry. Regarding the elimination of gaps between PV cells, the existing solution in the industry facilitates shingling of modules, which is to overlap edges of adjacent PV cells and use conductive glue for electrical connection at an overlapping position. However, the costs of the conductive glue are relatively high, and the conductive performance and connection reliability of the conductive glue are not stable. In view of the problems in the industry, the present invention provides a novel conductive member for electrically connecting PV cells.

To increase the power generation per unit area of a photovoltaic assembly, issues that need to be considered comprise how to improve the utilization of light on a surface of the module and how to reduce or eliminate gaps between adjacent PV cells. Regarding the improvement of the utilization of light, on the one hand, a conductive member, as a connecting medium for adjacent PV cells, needs to be covered on surfaces of the PV cells. Because a region covered by the conductive member cannot receive light, the power generation of the PV cells is reduced. On the other hand, in addition to light vertically irradiated on the surfaces of the PV cells, light reflected by other objects on the surfaces of the PV cells can also bring a certain gain in cell power. Therefore, how to reduce the shielding of light on the surfaces of the cells and how to make use of the reflected light efficiently are issues to be considered in the industry. Regarding the elimination of gaps between PV cells, the existing solution in the industry facilitates shingling of modules, which is to overlap edges of adjacent PV cells and use conductive glue for electrical connection at an overlapping position. However, the costs of the conductive glue are relatively high, and the conductive performance and connection reliability of the conductive glue are not stable. In view of the problems in the industry, the present invention provides a novel conductive member for electrically connecting PV cells.

Figure 1A:
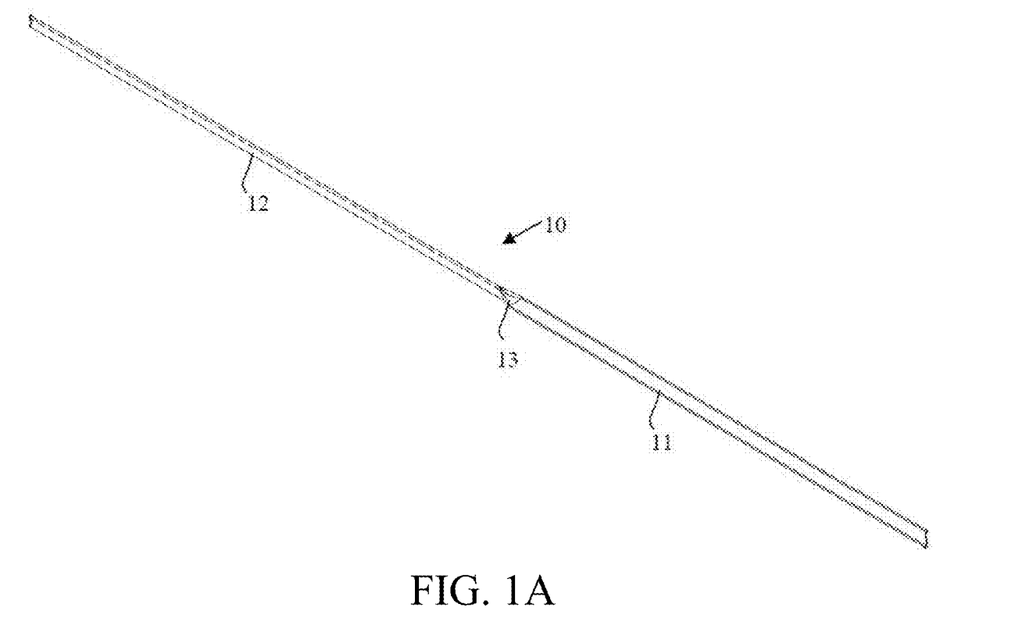
FIG. 1A is a perspective view of a reflective conductive member according to an embodiment of the present invention.
Figure 1B:
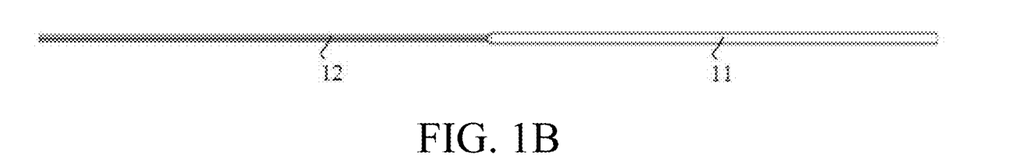
FIG. 1B is a top view of the conductive member shown in FIG. 1A.

FIG. 1A and FIG. 1B are schematic structural diagrams of a conductive member according to an embodiment of the present invention. As shown in FIG. 1A and FIG. 1B, a conductive member 10 comprises a non-light-reflective section 11 and a light-reflective section 12 integrally formed in a length direction of the conductive member. The non-light-reflective section 11 is used for electrical connection with a back surface (that is, a backlight surface) of a PV cell, and the light-reflective section 12 is used for electrical connection with a front surface (that is, a light-receiving surface) of a PV cell.

The definitions of the "light-reflective section" and the "non-light-reflective section" are as follows: The light-reflective section comprises a planar contact surface and a reflective surface opposite to the planar contact surface. The reflective surface can reflect light to the surface of the PV cell. The reflective surface comprises a curved surface or an inclined plane with a non-parallel contact surface. The non-light-reflective section comprises a planar contact surface and a non-contact surface back to the planar contact surface, and the non-contact surface is planar and substantially parallel to the contact surface.

In this embodiment of the present invention, the non-light-reflective section 11 has a first cross section perpendicular to a length direction of the non-light-reflective section, the light-reflective section 12 has a second cross section perpendicular to a length direction of the light-reflective section, and an area of the first cross section is substantially equal to an area of the second cross section. Since cross-sectional shapes of the non-light-reflective section 11 and the light-reflective section 12 are different, if the cross-sectional areas of the two sections are different, the manufacturing process of the conductive member is cumbersome, which is not conducive to mass production. Therefore, in a process of manufacturing the conductive member, cross-sectional areas of the non-light-reflective section 11 and the light-reflective section 12 need to be always kept the same to ensure the production capacity of the conductive member. In addition, when the cross-sectional areas of the non-light-reflective section 11 and the light-reflective section 12 are different, resistances of the two sections are not equal (provided that lengths of the two sections are equal). The different resistances cause power losses of the non-light-reflective section 11 and the light-reflective section 12 to be different, which further causes the mismatch of two adjacent PV cells.

Further, the conductive member 10 can further comprise a transition section 13 connected between the non-light-reflective section 11 and the light-reflective section 12, a height of the transition section 13 is less than a height of the light-reflective section 12 and greater than a height of the non-light-reflective section 11, and the height of the transition section 13 gradually increases in a direction away from the non-light-reflective section 11. A cross-sectional area of the transition section 13 perpendicular to the length direction of the conductive member is substantially equal to a cross-sectional area of the non-light-reflective section 11 or the light-reflective section 12 perpendicular to the length direction of the conductive member. Intuitively, the transition section 13 has a certain slope, and the existence of the slope can ensure a smooth transition between the non-light-reflective section 11 and the light-reflective section 12, to avoid forming a "step" shape at the junction of the two sections. In one aspect, the transition section 13 can improve the bending performance of the junction between the two sections and is not easy to break. In another aspect, the transition section 13 can further avoid scratches on surfaces or edges of PV cells in contact with the transition section.

Figure 2A:
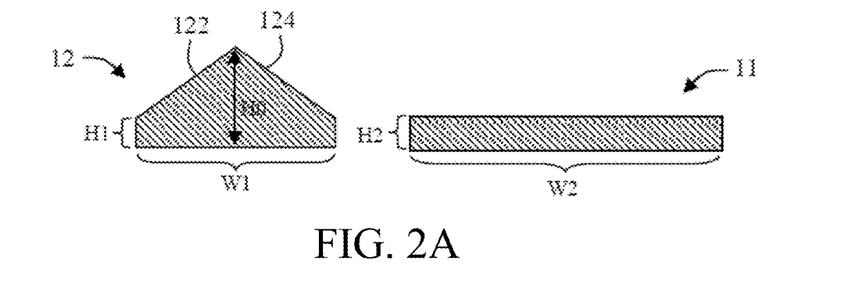
FIG. 2A shows cross-sectional views of a light-reflective section and a non-light-reflective section of the conductive member along directions perpendicular to respective length directions according to an embodiment of the present invention.

As shown in FIG. 2A, in this embodiment of the present invention, the non-light-reflective section 11 can be roughly flat, and the cross section perpendicular to the length direction of the non-light-reflective section is roughly rectangular; the cross section of the light-reflective section 12 perpendicular to the length direction of the light-reflective section is hexagonal, and the light-reflective section 12 has two reflective surfaces 122 and 124 respectively extending in the length direction of the conductive member. Certainly, in other feasible implementations, the cross-sectional shape of the light-reflective section 12 perpendicular to the length direction of the light-reflective section can be of, but not limited to: triangle, trapezoid, circle, ellipse, polygon, and the like. In this embodiment, a width of the contact surface of the light-reflective section 12 perpendicular to the length direction of the conductive member is defined as W1, a width of the contact surface of the non-light-reflective section 11 perpendicular to the length direction of the conductive member is defined as W2, and W1≤W2 is required. Since W1≤W2, in one aspect, a shielding area of the light-reflective section 12 to the front surface of the cell (that is, the light-receiving surface) can be effectively reduced. In another aspect, a contact area between the non-light-reflective section 11 and the back surface of the cell can be increased, thereby ensuring the reliability of welding between the back surface of the cell and the non-light-reflective section 11. In addition, because the light mainly comes from the front side of the cell, the widening of the non-light-reflective section 11 has negligible impact on the power generation of the cell. Certainly, in some other embodiments, W1>W2 is also feasible. In this embodiment, the foregoing cross section of the light-reflective section 12 is roughly divided into an upper triangular part and a lower rectangular part. A height of the rectangular part is defined as H1, and a height (that is, a distance from the contact surface to the triangular part) of the light-reflective section 12 is defined as H0. To facilitate production, H0>H2 and H1=H2 need to be satisfied. When H1 and H2 are equal, it is convenient to perform cold roll forming (described in detail below) by means of two rollers, and the production efficiency is high.

For a double-sided cell (that is, both front and back surfaces of the cell generate electricity), the utilization of light on the back surface of the cell is equally important. Therefore, an embodiment of the present invention further provides a conductive member comprising two light-reflective sections.

Figure 2B:
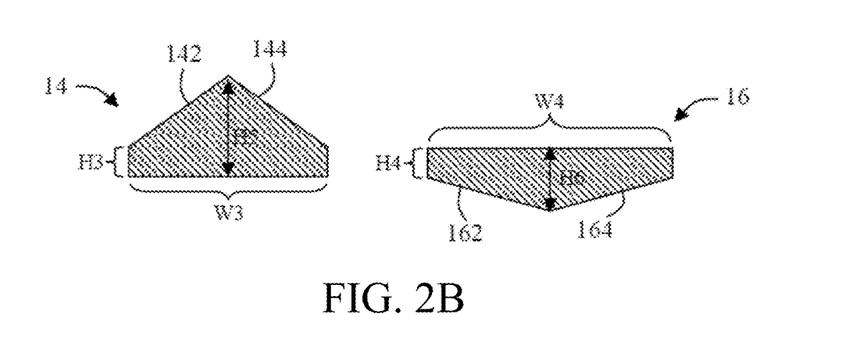
FIG. 2B shows cross-sectional views of two light-reflective sections of the conductive member along directions perpendicular to respective length directions of the light-reflective sections according to another embodiment of the present invention.

As shown in FIG. 2B, in an embodiment, a conductive member comprises a first light-reflective section 14 and a second light-reflective section 16 integrally formed in a length direction of the conductive member. The first light-reflective section 14 has a contact surface and first reflective surfaces 142 and 144 away from the contact surface. The second light-reflective section 16 has a contact surface and second reflective surfaces 162 and 164 away from the contact surface. The first reflective surfaces 142 and 144 and the second reflective surfaces 162 and 164 are respectively located on different sides in a height direction of the conductive member. In other words, it is defined that the conductive member has an upper side and a lower side in the height direction. The first reflective surfaces 142 and 144 is located on the upper side, and the second reflective surfaces 162 and 164 is located on the lower side. Similarly, a cross-sectional area of the first light-reflective section 14 perpendicular to a length direction of the first light-reflective section is substantially equal to a cross-sectional area of the second light-reflective section 16 perpendicular to a length direction of the second light-reflective section. In this embodiment, the cross sections of the first light-reflective section 14 and the second light-reflective section 16 are each divided into a rectangular part and a triangular part in the height direction. A height of the rectangular part of the first light-reflective section 14 is defined as H3, a height of the rectangular part of the second light-reflective section 16 is defined as H4, a height of the first light-reflective section 14 is defined as H5, a height of the second light-reflective section 16 is defined as H6, a width of the contact surface of the first light-reflective section 14 perpendicular to the length direction of the conductive member is defined as W3, a width of the contact surface of the second light-reflective section 16 perpendicular to the length direction of the conductive member is defined as W4, and the following conditions need to be satisfied: W3≤W4, H3=H4, and H5≥H6. Since the utilization of front light has greater impact on the power gain of the double-sided cell, when W3≤W4, the shielding area of the conductive member on the front surface of the cell can be reduced while the contact area between the conductive member and the back surface of the cell can be ensured. When H3=H4, the manufacture of the conductive member is easier. Certainly, in some other embodiments, W3≥W4 is also feasible.

Figure 2C:
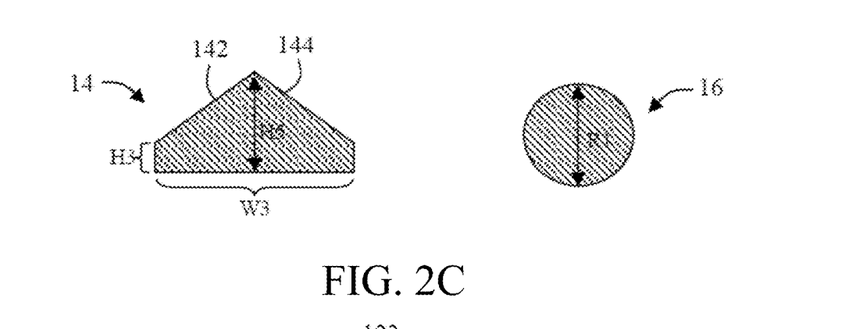
FIG. 2C shows cross-sectional views of two light-reflective sections of the conductive member along directions perpendicular to respective length directions of the light-reflective sections according to another embodiment of the present invention.

FIG. 2C shows another conductive member comprising two light-reflective sections. The difference from FIG. 2B is that a cross section of a second light-reflective section 16 perpendicular to a length direction of the second light-reflective section is circular or elliptical, which also achieves a light reflecting effect. A diameter of the second light-reflective section 16 is defined as R1.

In this embodiment of the present invention, the foregoing parameters need to satisfy the following conditions: 0.2 mm≤R1≤0.45 mm; 0.2 mm≤W3≤0.6 mm; and 0.2 mm≤H5≤0.6 mm.

In an embodiment, the conductive member further comprises a transition section (not shown) connected between the first light-reflective section 14 and the second light-reflective section 16, and the transition section is flat (that is, a cross section perpendicular to the length direction of the conductive member is rectangular).

Figure 3A:
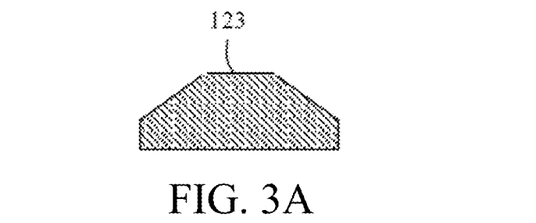
FIG. 3A to FIG. 3C show cross-sectional views of several other types of light-reflective sections along directions perpendicular to respective length directions.
Figure 3B:
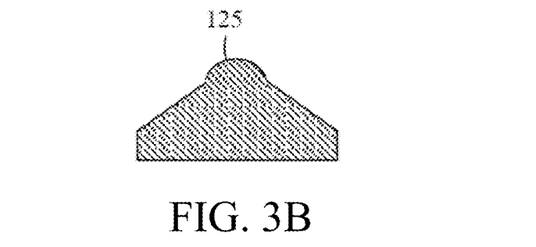
Figure 3C:
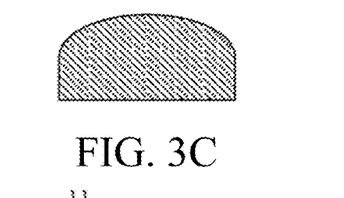

FIG. 3A to FIG. 3C are schematic cross-sectional views of several other types of light-reflective sections. As shown in FIG. 3A, a light-reflective section has a planar top 123 extending in the length direction of the conductive member, and the planar top 123 is substantially parallel to a contact surface of the light-reflective section. As shown in FIG. 3B, a light-reflective section has an arc top 125 extending in the length direction of the conductive member. The planar top 123 and the arc top 125 can reduce the pressure caused by the light-reflective section on a packaging film during module lamination, and the existence of the planar top 123 and the arc top 125 can further control a height of the light-reflective section, thereby facilitating the module lamination process.

Figure 4:
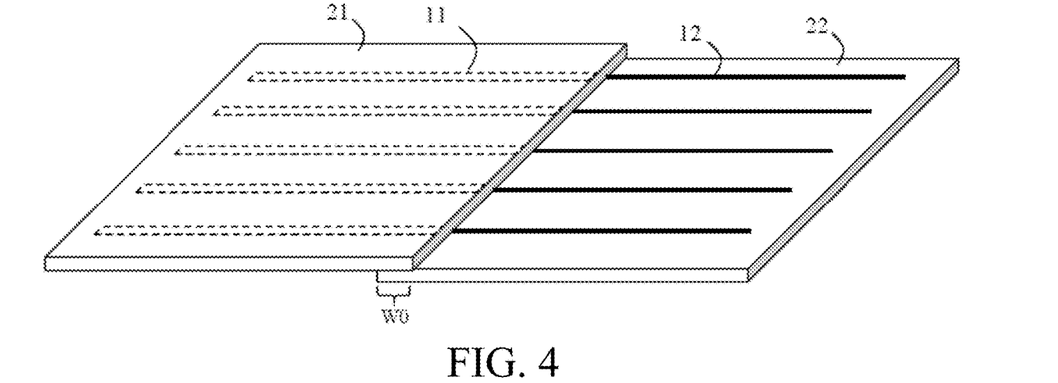
FIG. 4 shows a connection status of two adjacent photovoltaic (PV) cells according to an embodiment of the present invention.

FIG. 4 shows a connection status of two adjacent PV cells according to an embodiment of the present invention. As shown in FIG. 4, a photovoltaic module comprises a first PV cell 21, a second PV cell 22, and a conductive member electrically connecting the first PV cell 21 and the second PV cell 22. The conductive member has a non-light-reflective section 11 electrically connected to a back surface of the first PV cell 21 and a light-reflective section 12 electrically connected to a front surface of the second PV cell 22. To increase the power generation per unit area of the module, edges of the two adjacent PV cells overlap to form an overlapping region, and the conductive member passes through the overlapping region. A width of the overlapping region in a length direction of the conductive member is W0, where W0≤1.0 mm, and more preferably, 0.3 mm≤W0≤1.0 mm. Since the adjacent cells are electrically connected through the longitudinally extending conductive member, compared with a shingled member connected by conductive glue, the yield is higher and the cost is more advantageous, and the width of the overlapping region in a length direction of the conductive member can be further reduced.

Figure 5:
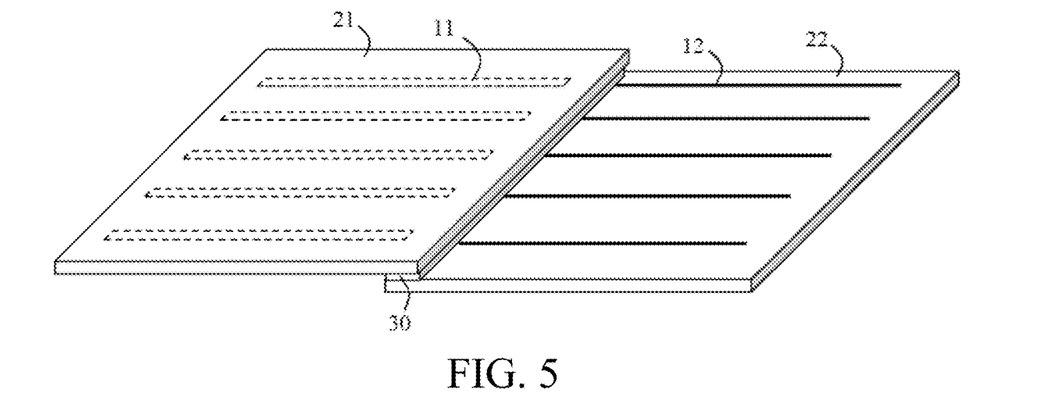
FIG. 5 shows a connection status of two adjacent PV cells according to another embodiment of the present invention.

As shown in FIG. 5, the difference from FIG. 4 is that a buffer material layer 30 between the conductive member and the PV cells is added in the overlapping region, and the buffer material layer 30 relieves the hard contact between the conductive member and the PV cells, thereby alleviating the cell split problem due to the hard contact. The buffer material layer 30 can be made of a material with certain elasticity or flexibility, for example, ethylene-vinyl acetate copolymer (EVA).

Figure 6:
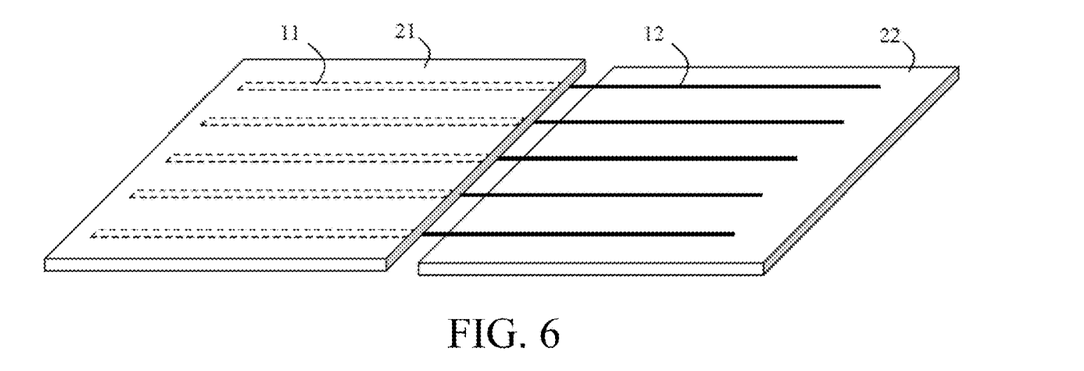
FIG. 6 shows a connection status of two adjacent PV cells according to still another embodiment of the present invention.

As shown in FIG. 6, the difference from FIG. 4 is that there can be a certain gap between two adjacent cells (for example, less than 0.5 mm), and the conductive member passes from a front surface of one cell to a back surface of the other cell through the gap.

It should be noted that FIG. 4 to FIG. 6 only exemplarily show the quantity of conductive members welded on the surfaces of the cells, but the quantity is not limited in the present invention and can be adjusted to 9 or 12 according to requirements.

Figure 7A:
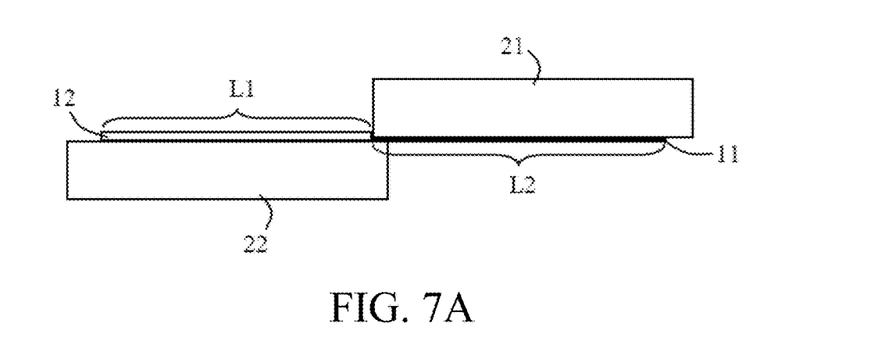
FIG. 7A is a cross-sectional view of two adjacent PV cells according to an embodiment of the present invention.

As shown in FIG. 7A, in this embodiment of the present invention, part of the non-light-reflective section 11 is sandwiched in the overlapping region. Since a contact area between the non-light-reflective section 11 and the cell is larger, the hard contact pressure between the conductive member and the cell in the overlapping region can be reduced, and the probability of the cell being fractured at the overlapping position can be further reduced. Further, the light-reflective section 12 can be disposed outside the overlapping region, to prevent the light-reflective section 12 with a sharp top from scratching the surface of the cell in the overlapping region, and prevent the light-reflective section 12 from fracturing the cell.

In this embodiment of the present invention, a length L1 of the light-reflective section 12 is less than a length L2 of the non-light-reflective section 11, and in the non-light-reflective section 11, a length of a segment electrically connected to the back surface of the first PV cell 21 and exposed out of the overlapping region is equal to L1, and a length of another segment sandwiched in the overlapping region is: L2−L1. Further, when lengths of a front electrode and a back electrode of the PV cell are the same, a difference between the lengths of the non-light-reflective section 11 and the light-reflective section 12 is: L2−L1. A width of the overlapping region in the length direction of the conductive member is defined as W0. Therefore, (L2−L1)≥W0 is required, so that only the flat non-light-reflective section 11 is sandwiched in the overlapping region.

Figure 7B:
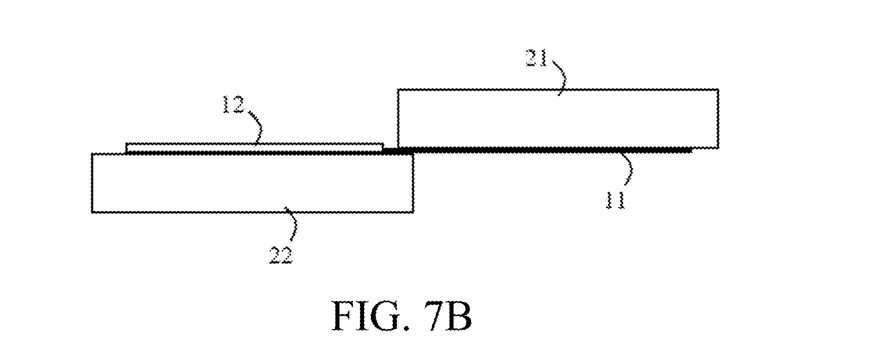
FIG. 7B is a cross-sectional view of two adjacent PV cells according to another embodiment of the present invention.

As shown in FIG. 7B, the difference from FIG. 7A is that there is a certain distance between an end of the light-reflective section 12 and the overlapping region, thereby further reducing the possibility of scratching the cell or cell split.

Figure 8:
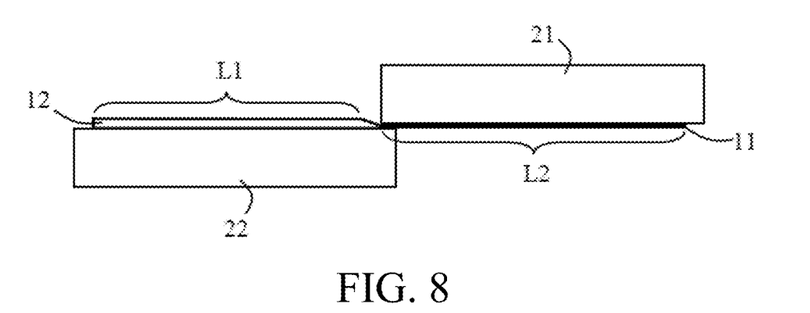
FIG. 8 is a cross-sectional view of two adjacent PV cells according to still another embodiment of the present invention.

As shown in FIG. 8, the difference from FIG. 7A is that the conductive member comprises a transition section connected between the light-reflective section 12 and the non-light-reflective section 11, and the transition section and the light-reflective section 12 are both located outside the overlapping region.

Next, the manufacturing method of the foregoing conductive member and a related apparatus are described with reference to FIG. 9A to FIG. 12B.

Figure 9A:
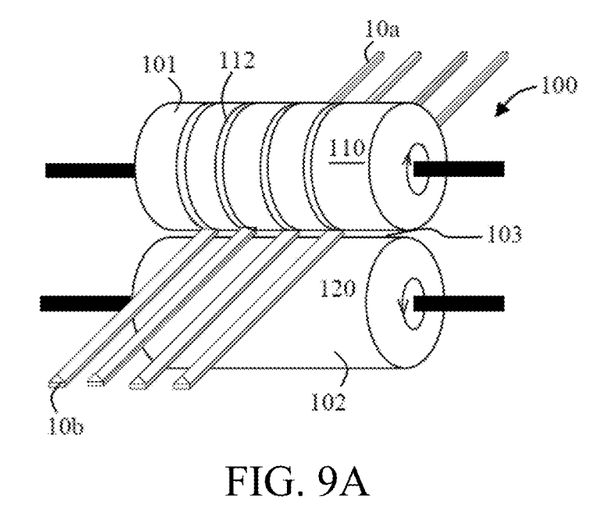
FIG. 9A and FIG. 9B are schematic structural diagrams of a conductive member production apparatus according to a first embodiment of the present invention.
Figure 9B:
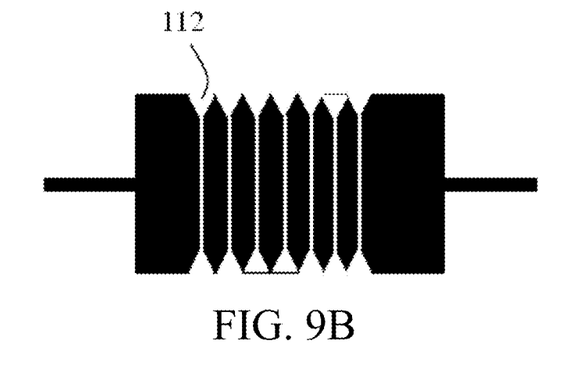

FIG. 9A and FIG. 9B are schematic structural diagrams of a conductive member production apparatus 100 according to a first embodiment of the present invention. The apparatus 100 is configured to produce continuous reflective conductive members. The apparatus 100 comprises: a first roller (for example, a tungsten steel roller) 101 and a second roller 102. The first roller 101 and the second roller 102 are both cylindrical, and there is a gap 103 between the two rollers. The first roller 101 has a first calendering surface 110, and the second roller 102 has a second calendering surface 120. One or more parallel grooves 112 of corresponding shapes are pre-manufactured on the first calendering surface 110 by mechanical grinding or laser engraving. An extending direction of the groove 112 is perpendicular to a rotation shaft of the first roller 101. An extension length of the groove 112 is equal to a circumference of a cross section of the first roller 101 perpendicular to the rotation shaft. Taking the light-reflective section shown in FIG. 2A as an example, a cross section of the groove 112 perpendicular to the extending direction is substantially triangular, and a width of the groove 112 gradually increases from an inside to an outside of the first roller 101.

Correspondingly, the working process of the apparatus 100 is roughly as follows:

S101: Arrange a to-be-processed conductive material 10a (for example, a circular conductive tape or rectangular conductive tape) in the extending direction of the groove 112, and place the conductive material 10a in the gap 103 between the first roller 101 and the second roller 102.

S102: Drive the first roller 101 and the second roller 102 to rotate relative to each other, rotation directions of the rollers being opposite. During this process, the conductive material 10a is continuously fed between the first roller 101 and the second roller 102, so that a continuous reflective conductive member 10b can be manufactured.

The continuous reflective conductive member 10b is divided into a lower rectangular part and an upper triangular part in a height direction, and a height of the rectangular part is substantially equal to the gap 103.

Figure 10A:
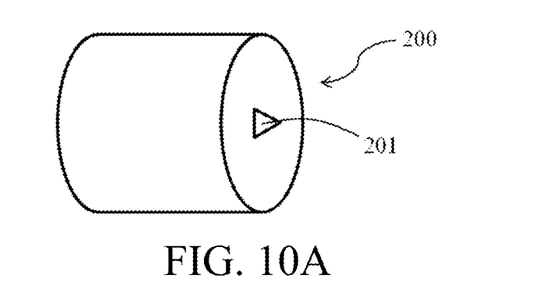
FIG. 10A and FIG. 10B are schematic structural diagrams of a conductive member production apparatus according to a second embodiment of the present invention.
Figure 10B:
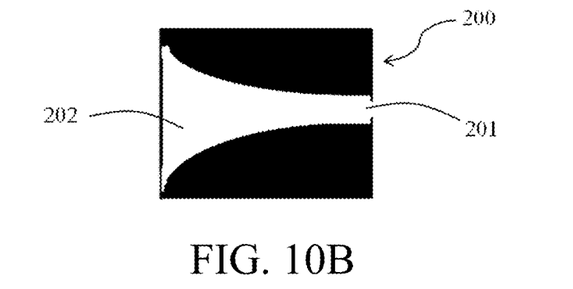

FIG. 10A and FIG. 10B are schematic structural diagrams of a conductive member production apparatus 200 according to a second embodiment of the present invention. The apparatus 200 is also configured to produce continuous reflective conductive members. The apparatus 200 is processed by metal drawing. The apparatus 200 comprises a longitudinally extending drawing channel. The drawing channel comprises a feeding port 202 and a discharging port 201. From the feeding port 202 to the discharging port 201, a cross-sectional area of the drawing channel perpendicular to a longitudinal direction of the drawing channel gradually decreases. When the shape of the discharging port 201 is triangular, a cross section of a produced conductive member is roughly triangular.

Figure 11A:
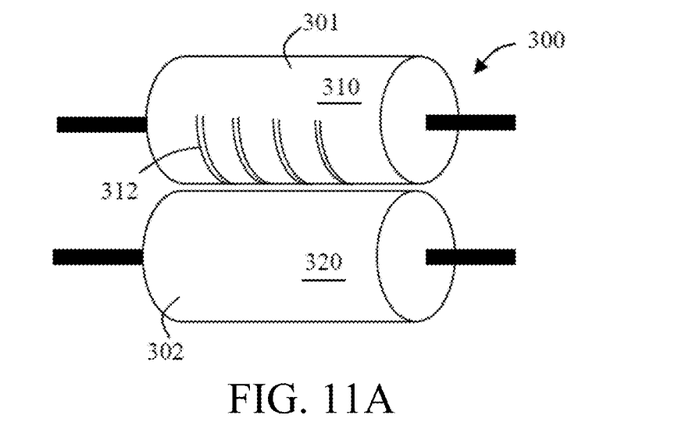
FIG. 11A and FIG. 11B are schematic structural diagrams of a conductive member production apparatus according to a third embodiment of the present invention.
Figure 11B:
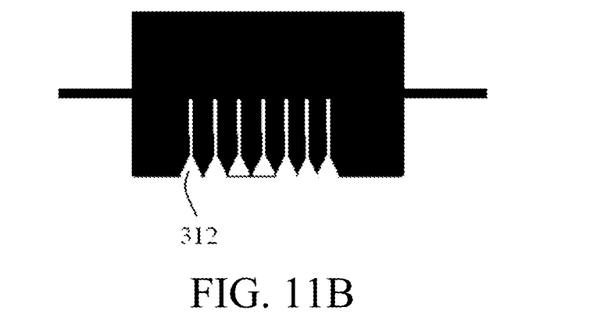

FIG. 11A and FIG. 11B are schematic structural diagrams of a conductive member production apparatus 300 according to a third embodiment of the present invention. The apparatus 300 is configured to produce non-continuous reflective conductive members (that is, comprising light-reflective sections and non-light-reflective sections). The non-light-reflective section and light-reflective section are disposed periodically. A combined section formed by a light-reflective section with a length of L1 and a non-light-reflective section with a length of L2 is defined as a period, and a length of the combined section is defined as L3=L1+L2. The apparatus 300 comprises a first roller 301 and a second roller 302. Similarly, the first roller 301 and the second roller 302 are both cylindrical. The first roller 301 has a first calendering surface 310, and the second roller 302 has a second calendering surface 320. In this embodiment, the following conditions need to be satisfied: a circumference of a cross section of the first roller 301 perpendicular to a rotation shaft of the first roller is equal to the foregoing length L3, or equal to an integer multiple of the foregoing length L3. Grinding or laser processing is performed on the first calendering surface 310, so that one or more grooves 312 are formed on the first calendering surface 310. An extending direction of the groove 312 is perpendicular to a rotation shaft of the first roller 301. An extension length of the groove 312 is L4=L1. In an example, if a circumference of the cross section of the first roller 301 perpendicular to the rotation shaft is equal to the foregoing length L3, and L1=L2, L4=L1=L2=L3/2 is then required. A remaining region on the first calendering surface 310 except for the grooves 312 is planar.

Correspondingly, the working process of the apparatus 300 is roughly as follows:

S301: Place a to-be-processed conductive material (for example, a circular conductive tape or rectangular conductive tape) between the first calendering surface 310 and the second calendering surface 320, and align the conductive material with the grooves 312.

S302: Drive the first roller 301 and the second roller 302 to move relative to each other, rotation directions of the rollers being opposite. During this process, the conductive material is continuously fed between the first roller 301 and the second roller 302.

Figure 12A:
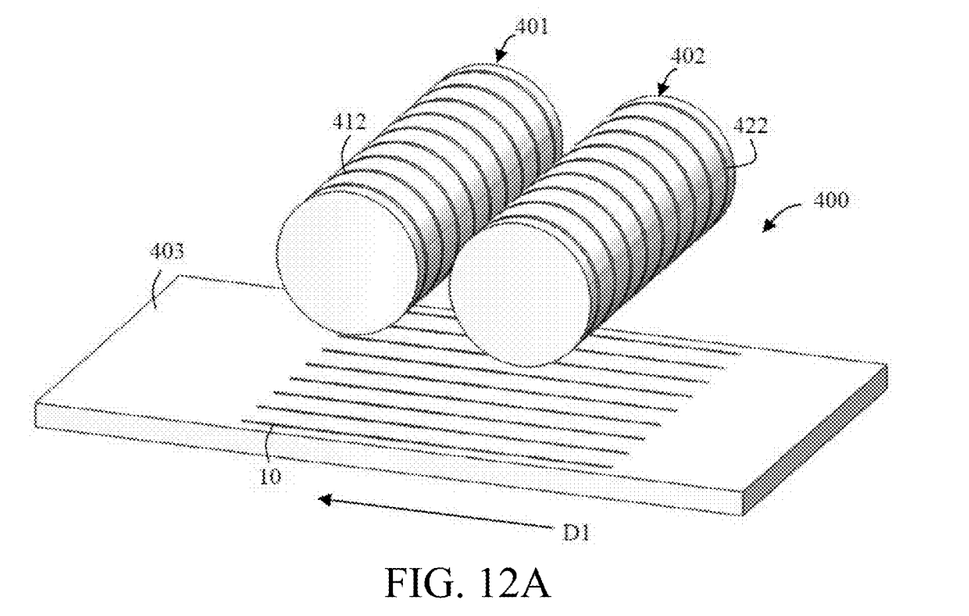
FIG. 12A and FIG. 12B are schematic structural diagrams of a conductive member production apparatus according to a fourth embodiment of the present invention.
Figure 12B:
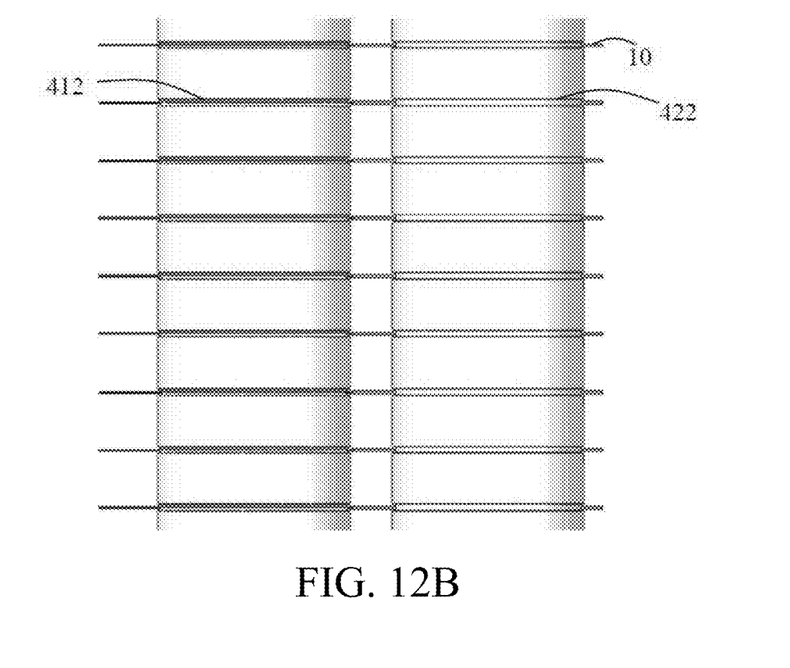

FIG. 12A and FIG. 12B are schematic structural diagrams of a conductive member production apparatus 400 according to a fourth embodiment of the present invention. The apparatus 400 is configured to produce reflective conductive members that appear periodically (that is, comprising light-reflective sections and non-light-reflective sections), and can also produce reflective conductive members that do not appear periodically. Specifically, the apparatus 400 comprises a rolling platform 403, and a first roller 401 and a second roller 402 that are located above the rolling platform 403. A distance between the first roller 401 and the rolling platform 403 is equal to a distance between the second roller 402 and the rolling platform 403. The first roller 401 has a first calendering surface that matches the rolling platform 403, and the second roller 402 has a second calendering surface that matches the rolling platform 403. One or more rows of first grooves 412 extending in a rotation direction of the first roller are formed on the first calendering surface, and one or more rows of second grooves 422 extending in a rotation direction of the second roller are formed on the second calendering surface. The first grooves 412 are configured to press the light-reflective section, and the second grooves 422 are configured to press the non-light-reflective section. The first grooves 412 and the second grooves 422 are both arranged at equal intervals, and a distance between two adjacent first grooves 412 is equal to a distance between two adjacent second grooves 422. In addition, positions of the first grooves 412 and the second grooves 422 are aligned in the rotation direction of the rollers. In this example, a cross section of the first groove 412 perpendicular to a length direction of the first groove can be triangular or trapezoidal, and a cross section of the second groove 422 perpendicular to a length direction of the second groove is substantially rectangular. A length of the first groove 412 is substantially equal to the length of the light-reflective section, and a length of the second groove 422 is substantially equal to the length of the non-light-reflective section. In this embodiment of the present invention, the length of the light-reflective section is defined as L1, the length of the non-light-reflective section is defined as L2, and a distance between the first roller 401 and the second roller 402 is defined as L5, then L5=L1=L2 is required.

Correspondingly, the working process of the apparatus 400 is roughly as follows:

S401: Move the first roller 401 and the second roller 402 away from the rolling platform 403.

S402: Place a to-be-rolled conductive material (for example, a circular conductive tape) on the rolling platform 403, and arrange the conductive material along the first grooves 412 and the second grooves 422 at equal intervals.

S403: Drive the first roller 401 and the second roller 402 to move toward the rolling platform 403 until the first roller 401 and the second roller 402 are in contact with the rolling platform 403.

S404: Drive the first roller 401 and the second roller 402 to roll in a direction D1 in the figure. A rolling distance of the first roller 401 and the second roller 402 is substantially equal to the length of the light-reflective section or the length of the non-light-reflective section.

In another embodiment, when the material of the conductive member is a flat conductive member, only a part of the material section needs to be periodically rolled, so that the rolled flat conductive section is deformed into a triangular conductive section. Correspondingly, in this embodiment, one of the first roller 401 and second roller 402 can be omitted, and corresponding grooves can be arranged on the single roller.

In a specific embodiment of the present invention, a "slope-shaped" transition section needs to be rolled between the light-reflective section and the non-light-reflective section. Specifically, a rolling tool can be used to roll the transition section between the light-reflective section and the non-light-reflective section in an inclined manner, thereby obtaining a "slope-shaped" transition section.

In this embodiment of the present invention, the conductive member can comprise a conductive substrate (for example, a copper substrate) and a soldering layer (for example, a tin layer) at least covering a contact surface of the conductive substrate. In a process of rolling a special-shaped conductive member, the conductive substrate can be used as a material for the rolling process. After the required segmented special-shaped conductive member is obtained by rolling forming, a corresponding soldering layer is formed on a contact surface of the special-shaped conductive member. Certainly, in an optional embodiment, a conductive member with a solder mask layer can be produced first, and the conductive member is then used as the material for the rolling process. This is not limited in this specification.

Figure 13:
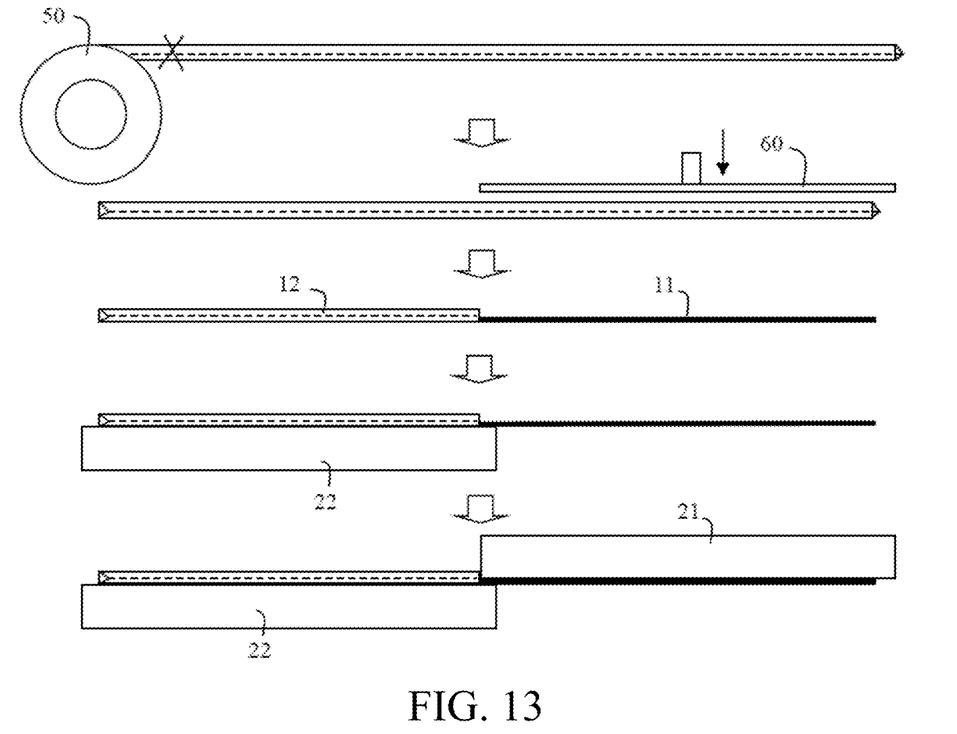
FIG. 13 shows a manufacturing process of a photovoltaic module according to an embodiment of the present invention.

FIG. 13 shows a manufacturing process of a photovoltaic module according to an embodiment of the present invention. The method comprises steps S1 to S5:

Step S1: Provide a first PV cell 21.

Step S2: Provide a second PV cell 22.

Step S3: Provide a conductive member with a preset length. The conductive member comprises a non-light-reflective section 11 and a light-reflective section 12. A cross-sectional area of the non-light-reflective section 11 perpendicular to a length direction of the conductive member is equal to a cross-sectional areas of the light-reflective section 12 perpendicular to the length direction of the conductive member.

Step S4: Electrically connect the non-light-reflective section 11 to a back surface of the first PV cell 21.

Step S5: Electrically connect the light-reflective section 12 to a front surface of the second PV cell 22.

A sequence of steps S1 to S5 is not necessarily limited.

In an embodiment, step S3 comprises S31 and S32:

S31: Provide a non-light-reflective conductive member with a predetermined length, the non-light-reflective conductive member being divided into a first section and a second section that are connected.

S32: Apply deformation pressure to the first section of the non-light-reflective conductive member to transform the first section into a light-reflective section.

As shown in FIG. 13, in another embodiment, step S3 comprises S33 and S34:

S33: Provide a reflective conductive member with a predetermined length, the reflective conductive member being divided into a first section and a second section that are connected. For example, a triangular conductive member with a certain length is pulled out from a reel 50 for accommodating the conductive member and cut.

S34: Apply deformation pressure to the first section of the reflective conductive member to transform the first section into a non-light-reflective section. For example, a pressure plate 60 is used to apply pressure to a section of the foregoing triangular conductive member to deform the section into the non-light-reflective section 11.

In an embodiment, the method further comprises: overlapping edges of the first PV cell 21 and the second PV cell 22 to form an overlapping region, and enabling the conductive member to pass through the overlapping region.

In an embodiment, the method further comprises: sandwiching a part of the non-light-reflective section 11 in the overlapping region.

In an embodiment, step S5 further comprises: electrically connecting, outside the overlapping region, the light-reflective section 12 of the conductive member to the front surface of the second PV cell 22.

Figure 14:
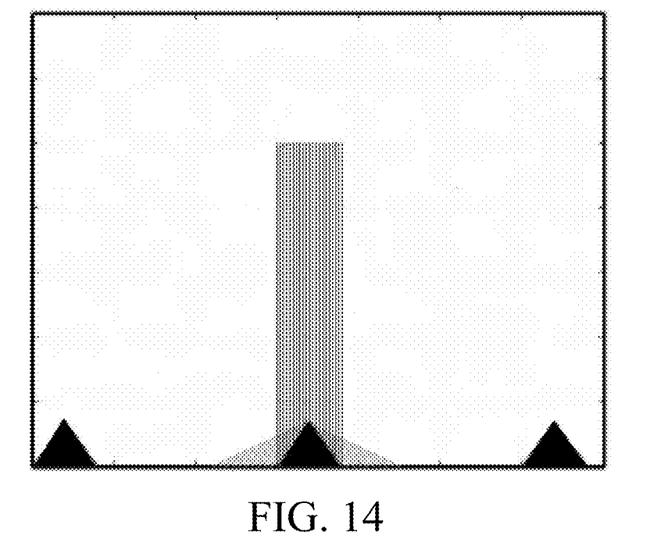
FIG. 14 to FIG. 16 are respectively schematic diagrams of reflection paths of parallel light rays by light-reflective sections.
Figure 15:
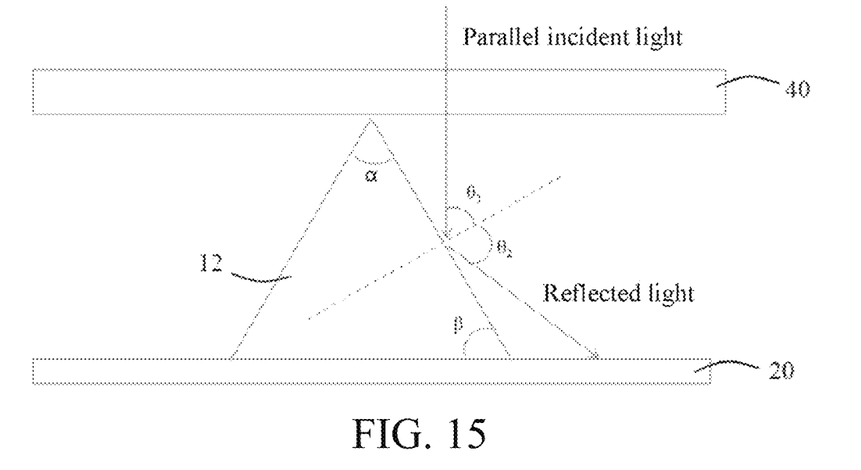
Figure 16:
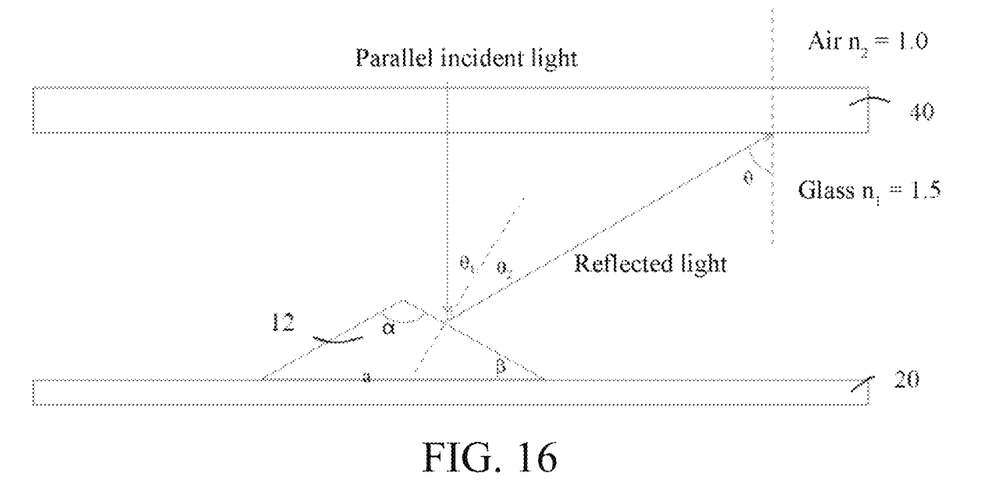

Next, FIG. 14 to FIG. 16 show reflection paths of parallel light vertically irradiated on cell surfaces by light-reflective sections. Only parallel light beams perpendicular to a surface of a PV cell are used as an example for description in this specification. Certainly, light that can be used is not limited to the parallel light beams. The parallel light beams perpendicular to the surface of the PV cell pass through a transparent front plate 40 and are irradiated on a reflective surface of the light-reflective section 12 welded on the surface of the PV cell 20.

In this embodiment of the present invention, a height range of the non-light-reflective section is 0.1 to 0.32 mm or 0.2 to 0.6 mm, and a width range of the contact surface of the light-reflective section is 0.2 to 0.9 mm or 0.2 to 0.6 mm, to effectively reduce the thickness of the packaging film (for example, EVA), ensure the yield of module lamination, and reduce costs. In addition, a width range of the contact surface of the non-light-reflective section is 0.2 to 1.4 mm or 0.2 to 1.6 mm, and a height range of the non-light-reflective section is 0.05 to 0.3 mm, thereby ensuring that the non-light-reflective section has a relatively large contact area with the back surface of the cell, increasing the welding tension, and improving the reliability of the product.

In this embodiment of the present invention, the portion of the non-light-reflective section that is in contact with the light-receiving surface of the cell has a length of 0.6 to 1.4 mm in the length direction of the conductive member, and a distance between two adjacent cell strings is 2.0 to 3.0 mm. Since parallel incident light passes through the front plate and the transparent packaging film, and is then irradiated on the cell and the reflective conductive member, the light irradiated on the cell can be directly absorbed and converted into electrical energy. Some of the light irradiated on the reflective conductive member is directly reflected to the cell, and some of the light is reflected to the front plate and then reflected to the cell for the second time.

Taking the light-reflective section comprising two reflective surfaces away from the contact surface as an example, an angle formed between the two reflective surfaces needs to meet certain conditions, and an angle range is deduced below.

Taking the two reflective surfaces being the same as an example, a side length corresponding to the reflective surface in a cross section is defined as a, the angle formed between the two reflective surfaces is defined as a, an angle formed between the reflective surface and the contact surface is defined as β, a refractive index of the front plate (for example, glass) is defined as n1, the refractive index of air is defined as n2, and a critical total internal reflective angle is defined as θ.

To reflect the parallel incident light to the cell surface as much as possible, the following conditions are required:

1. Condition for direct reflection to the cell:
an incident angle is equal to a reflective angle:
θ1=θ2;
it can be learned from a geometric relationship that:
β=θ1=θ2;
β+β+α=180°;
to ensure that reflected light is directly reflected to the cell surface, the following condition is required:
θ1+θ2>90°;
that is, α<90°.

2. Condition for total internal reflection:
the critical total internal reflective angle θc:
θc=arcsin (n2/n1);
it can be learned from a geometric relationship that:
θ=θ1+θ2;
β=θ1=θ2;
β+β+α=180°,
to ensure that all light reflected to the glass is reflected to the cell surface, the following condition is required:
θ>θc;
that is, α<180°−θc (where θc=41.5°, that is, α<138.5°).

To sum up, to enable the parallel light beams vertically irradiated on the cell surface to be reflected to the cell surface, α<138.5° is required.

Optionally, 60°≤α≤138.5°. When α=60°, the cross section of the light-reflective section is roughly equilateral triangle. When the light-reflective section is used, there is no need to distinguish the contact surface and reflective surface. Any one of the three surfaces can be used as a contact surface.

Optionally, 45°≤α≤60°, or 60°≤α≤90°, so that the light can be directly reflected to the cell surface, and absorbed by the cell and converted into photo-generated current.

Optional, 90°≤α≤97°, or 99°≤α≤138.5°, or 105°≤α≤138.5°, or 105°≤α≤120°, or 120°≤α≤138.5°.

According to the embodiments of the present invention, the light-reflective section in the conductive member is used to reflect light to a cell surface, thereby increasing the optical utilization of a light-receiving surface of the Photovoltaic module, and further increasing the power generation of the module. In another aspect, the non-light-reflective section is electrically connected to the back surface of the cell, to ensure the reliability of welding between the back surface of the PV cell and the conductive member.

It should be understood that, although this specification is described according to each embodiment, each embodiment may not include only one independent technical solution. The description manner of this specification is merely for clarity. This specification should be considered as a whole by a person skilled in the art, and the technical solution in each embodiment may also be properly combined, to form other embodiments that can be understood by a person skilled in the art.

The series of detailed descriptions listed above are only detailed descriptions of the feasible embodiments of the present invention, and are not intended to limit the protection scope of the present invention. Any equivalent embodiments or changes made without departing from the technical spirit of the present invention shall fall within the protection scope of the present invention.

What is claimed is:

1. A conductive member for electrically connecting photovoltaic (PV) cells having a first photovoltaic cell and a second photovoltaic cell, wherein the conductive member comprises a first segment and a second segment in a length direction of the conductive member, both the first segment and the second segment have a planar contact surface respectively contacting with the first photovoltaic cell and the second photovoltaic cell, the second segment has a reflective surface facing away from the planar contact surface of the second segment, the first segment has a first cross section perpendicular to a length direction of the first segment, the second segment has a second cross section perpendicular to a length direction of the second segment, wherein the first cross section and the second cross section have the same area;
wherein the second cross section of the second segment defines a rectangular part and a reflective part, and the first cross section of the first segment is formed as a rectangle, a height of the rectangular part of the second segment is equal to a height of the rectangle of the first segment.

2. The conductive member according to claim 1, wherein the reflective surface of the second segment comprises a first reflective surface and a second reflective surface, and an angle α formed between the first reflective surface and the second reflective surface satisfies one of the following conditions:

$$60°≤α≤138.5°; \text{ or}$$

$$60°≤α≤90°; \text{ or}$$

$$90°≤α≤138.5°; \text{ or}$$

$$99°≤α≤138.5°.$$

3. The conductive member according to claim 1, wherein the planar contact surface of the first segment has a first width perpendicular to the length direction of the first segment, and the planar contact surface of the second segment has a second width perpendicular to the length direction of the second segment, the first width is greater than the second width.

4. The conductive member according to claim 1, wherein the conductive member further comprises a transition section connected between the first segment and the second segment, a height of the transition section is less than a height of the second segment and greater than a height of the first segment, and the height of the transition section gradually increases in a direction away from the first segment.

5. The conductive member according to claim 1, wherein a width range of the planar contact surface of the second segment is 0.2 to 0.9 mm, a height range of the first segment is 0.1 to 0.32 mm, and a width range of the planar contact surface of the first segment is 0.2 to 1.4 mm.

6. The conductive member according to claim 1, wherein the first segment and the second segment are integrally formed, and a length of the first segment in a longitudinal direction of the first segment is greater than a length of the second segment in a longitudinal direction of the second segment.

7. The conductive member according to claim 1, wherein the second segment has an arc-shaped top or a planar top extending in the length direction of the second segment.

* * * * *